(12) United States Patent
Steiner et al.

(10) Patent No.: US 9,041,226 B2
(45) Date of Patent: May 26, 2015

(54) CHIP ARRANGEMENT AND A METHOD OF MANUFACTURING A CHIP ARRANGEMENT

(71) Applicant: Infineon Technologies AG, Neubiberg (DE)

(72) Inventors: Rainer Steiner, Regensburg (DE); Edward Fuergut, Dasing (DE); Khalil Hosseini, Weihmichl (DE); Georg Meyer-Berg, Munich (DE); Joachim Mahler, Regensburg (DE)

(73) Assignee: INFINEON TECHNOLOGIES AG, Neubiberg (DE)

( * ) Notice: Subject to any disclaimer, the term of this patent is extended or adjusted under 35 U.S.C. 154(b) by 0 days.

(21) Appl. No.: 13/798,141

(22) Filed: Mar. 13, 2013

(65) Prior Publication Data

US 2014/0264950 A1    Sep. 18, 2014

(51) Int. Cl.
| | |
|---|---|
| H01L 23/48 | (2006.01) |
| H01L 21/00 | (2006.01) |
| H01L 23/00 | (2006.01) |
| H01L 23/495 | (2006.01) |
| H01L 23/31 | (2006.01) |

(52) U.S. Cl.
CPC .......... *H01L 23/562* (2013.01); *H01L 23/3107* (2013.01); *H01L 2224/04105* (2013.01); *H01L 2224/06181* (2013.01); *H01L 2224/24246* (2013.01); *H01L 2224/2518* (2013.01); *H01L 2224/32245* (2013.01); *H01L 2224/92144* (2013.01); *H01L 24/06* (2013.01); *H01L 24/24* (2013.01); *H01L 24/25* (2013.01); *H01L 24/29* (2013.01); *H01L 24/32* (2013.01); *H01L 24/73* (2013.01); *H01L 24/82* (2013.01); *H01L 24/92* (2013.01); *H01L 2224/2929* (2013.01); *H01L 2224/29387* (2013.01); H01L 2224/73267 (2013.01); H01L 2224/92244 (2013.01); H01L 2924/10252 (2013.01); H01L 2924/10253 (2013.01); H01L 2924/10271 (2013.01); H01L 2924/10329 (2013.01); H01L 2924/1305 (2013.01); H01L 2924/13055 (2013.01); H01L 2924/13091 (2013.01); *H01L 23/49513* (2013.01); *H01L 23/49517* (2013.01); *H01L 23/49562* (2013.01); H01L 2924/07802 (2013.01); H01L 2924/1306 (2013.01)

(58) Field of Classification Search
USPC ............ 257/753, 783, 678, E23.16, E21.514, 257/E21.584, 672, 675, 693, 778, 787; 438/628, 644, 654, 100, 118, 121, 124
See application file for complete search history.

(56) References Cited

U.S. PATENT DOCUMENTS

| | | | |
|---|---|---|---|
| 5,353,498 A | 10/1994 | Fillion et al. | |
| 5,444,301 A * | 8/1995 | Song et al. | ..................... 257/737 |
| 7,129,585 B2 * | 10/2006 | Yoo | ................................ 257/778 |
| 7,786,558 B2 * | 8/2010 | Otremba | ........................ 257/678 |
| 8,334,593 B2 | 12/2012 | Mcconnelee et al. | |
| 8,507,320 B2 | 8/2013 | Otremba et al. | |
| 2009/0236749 A1 | 9/2009 | Otremba et al. | |

FOREIGN PATENT DOCUMENTS

DE    102009013818 A1    11/2009

\* cited by examiner

*Primary Examiner* — Jasmine Clark

(57) ABSTRACT

In various embodiments, a chip arrangement is provided. The chip arrangement may include a chip carrier and a chip mounted on the chip carrier. The chip may include at least two chip contacts and an insulating adhesive between the chip and the chip carrier to adhere the chip to the chip carrier. The at least two chip contacts may be electrically coupled to the chip carrier.

20 Claims, 14 Drawing Sheets

202 — Adhering a chip on a chip carrier, the chip carrier including at least two chip contacts, e.g. facing the chip carrier, wherein the chip is adhered to the chip carrier by means of insulating adhesive formed between the chip and the chip carrier 204 — Electrically coupling the at least two chip contacts facing the chip carrier to the chip carrier

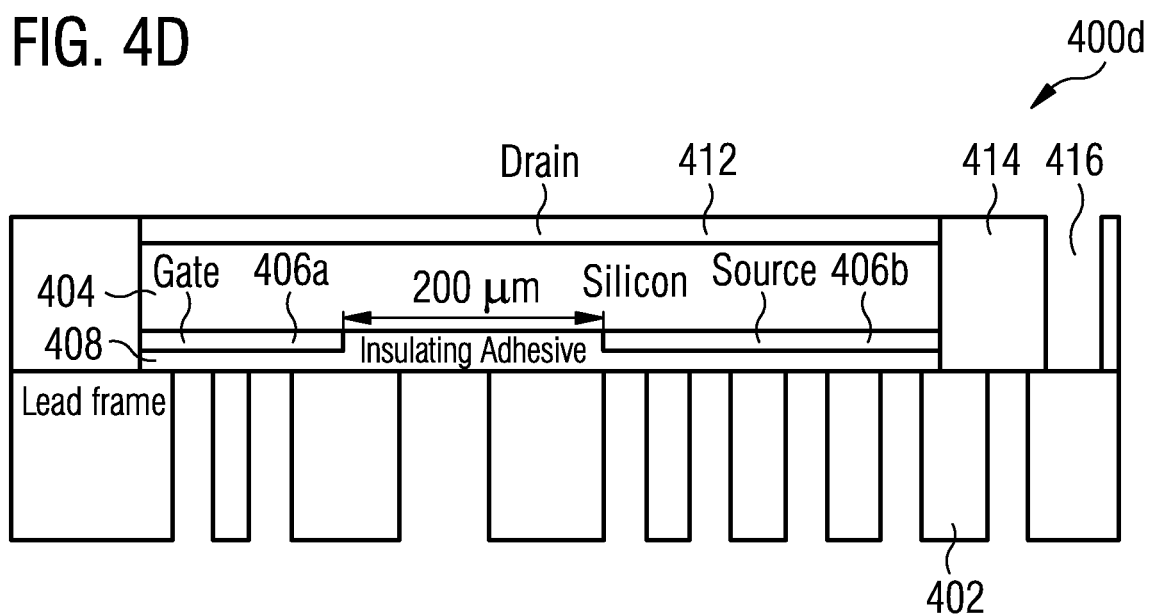

US 9,041,226 B2

CHIP ARRANGEMENT AND A METHOD OF MANUFACTURING A CHIP ARRANGEMENT

TECHNICAL FIELD

Various embodiments relate generally to chip arrangements and methods of manufacturing chip arrangements.

BACKGROUND

After soldering or adhering a chip to a metal substrate, the cooling of the soldered or adhered chip may result in very high thermo-mechanical stresses. This is due to the difference in the Coefficient of Thermal Expansion (CTE) between used materials, for instance, silicon and copper. Soldering is typically carried out at a temperature of about 380° C. while adhering is typically carried out at a temperature of about 200° C. The CTE of silicon is $2.5 \times 10^{-6}/°$ C. while the CTE of copper is $16.5/°$ C. During cooling from a high temperature to a low temperature, different materials contract differently due to different CTEs. The difference in contraction may lead to high thermo-mechanical stresses.

The high thermo-mechanical stresses may cause fractures within the substrates or cause thin chips (typically <<100 μm) to break. The substrate may also bend or warp due to the thermo-mechanical stresses. As a result, later manufacturing processes such as laser drilling, lamination and wire bonding may no longer be possible to be carried out. As such, the thermo-mechanical stresses due to the difference in CTE between different materials affects reliability of the chips.

SUMMARY

In various embodiments, a chip arrangement is provided. The chip arrangement may include a chip carrier and a chip mounted on the chip carrier. The chip may include at least two chip contacts (or chip terminals) and an insulating adhesive between the chip and the chip carrier to adhere the chip to the chip carrier. The at least two chip contacts (or chip terminals) facing the chip carrier may be electrically coupled to the chip carrier.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which:

FIG. 2 shows a schematic illustrating a method to manufacture a chip according to various embodiments;

FIG. 4, which includes FIGS. 4A to 4E, shows a method to manufacture a chip arrangement according to various embodiments; wherein FIG. 4A is a schematic of a chip with a plurality of chip contacts (or chip terminals) being adhered to chip carrier according to various embodiments; wherein FIG. 4B is a schematic of a chip arrangement including a chip carrier and a chip mounted on the chip carrier according to various embodiments; wherein FIG. 4C is a schematic of a chip arrangement including encapsulation material disposed at least laterally to the chip according to various embodiments; wherein FIG. 4D is a schematic of a chip arrangement including a through hole extending through the encapsulation material according to various embodiments; and wherein FIG. 4E is a schematic of a chip arrangement including at least a contact hole according to various embodiments;

FIG. 6, which includes FIGS. 6A to 6C, shows a method to manufacture a chip arrangement according to various embodiments; wherein FIG. 6A is a schematic of a chip with a plurality of chip contacts (or chip terminals) being adhered to chip carrier according to various embodiments; wherein FIG. 6B is a schematic of a chip arrangement after patterning is carried out on the chip arrangement according to various embodiments; and wherein FIG. 6C is a schematic of a chip arrangement after deposition of metal according to various embodiments; and FIG. 7, which includes FIGS. 7A and 7B, shows a method to manufacture a chip arrangement according to various embodiments; wherein FIG. 7A is a schematic of a chip with a plurality of chip contacts (or chip terminals) being adhered to chip carrier according to various embodiments; and wherein FIG. 7B is a schematic of a chip arrangement including forming a through hole extending through the encapsulation material according to various embodiments.

DESCRIPTION

The following detailed description refers to the accompanying drawings that show, by way of illustration, specific details and embodiments in which the invention may be practiced.

The word "exemplary" is used herein to mean "serving as an example, instance, or illustration". Any embodiment or design described herein as "exemplary" is not necessarily to be construed as preferred or advantageous over other embodiments or designs.

The word "over" used with regards to a deposited material formed "over" a side or surface, may be used herein to mean that the deposited material may be formed "directly on", e.g. in direct contact with, the implied side or surface. The word "over" used with regards to a deposited material formed "over" a side or surface, may be used herein to mean that the deposited material may be formed "indirectly on" the implied side or surface with one or more additional layers being arranged between the implied side or surface and the deposited material.

Various aspects of this disclosure provide an improved chip arrangement and a method of manufacturing the same that is able to address at least partially some of the abovementioned challenges.

Figure 1:
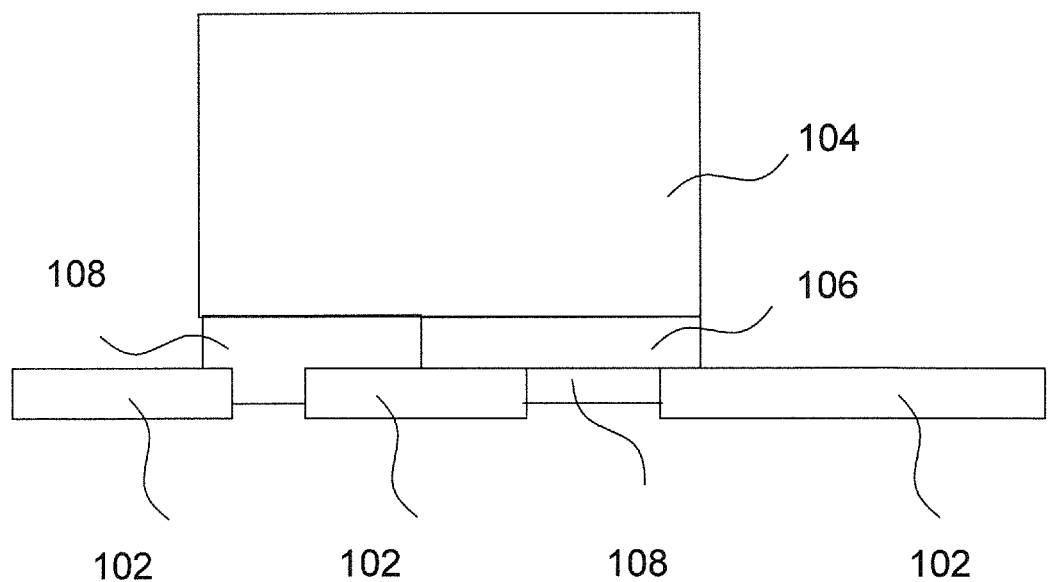
FIG. 1 shows a schematic illustrating a cross-sectional side view of a chip arrangement according to various embodiments.

FIG. 1 is a schematic 100 illustrating a cross-sectional side view of a chip arrangement according to various embodiments. The chip arrangement may include a chip carrier 102 and a chip 104 mounted on the chip carrier 102. The chip 104 may include at least two chip contacts (or chip terminals) 106, e.g. facing the chip carrier 102, and an (electrically) insulating adhesive 108 between the chip 104 and the chip carrier 102 to adhere the chip 104 to the chip carrier 102. The at least two chip contacts (or chip terminals) 106 facing the chip carrier 102 may be electrically coupled to the chip carrier 102.

The insulating adhesive 108 may be configured to accommodate the difference in contraction (or expansion) of different materials in the chip 104 and the chip carrier 102. The difference in contraction (or expansion) of different materials may be due to different CTEs. The chip 104 as well as the chip carrier 102 may no longer be rigidly soldered or adhered to each other. Various embodiments may provide for a reduction in thermo-mechanical stresses. Various embodiments may provide for the reduction in occurrence of fractures, bending or/and warping.

The chip contact(s) 106 may also be referred to as a chip terminal(s) and vice versa. The chip may include a side facing the chip carrier 102, a side facing away from the chip carrier 102, as well as two sidewalls (or lateral sides) extending from the side facing the chip carrier 102 to the side facing away from the chip carrier 102.

In various embodiments, the insulating adhesive 108 may partially cover the at least two chip contacts (or chip terminals) 106.

In various embodiments, the chip carrier 102 may include a leadframe. The leadframe may be a pre-structured leadframe or a post-structured leadframe. In other words, the leadframe may be prefabricated before adhering the chip carrier 102 to the chip 104 or may be formed after adhering the chip carrier 102 to the chip 104. In various embodiments, the post-structured leadframe may be formed by adhering conductive pads to the chip 104 with the adhesive 108. In various embodiments, the post-structured leadframe may be formed by forming trenches or hollow structures on an non-patterned leadframe, e.g. by means of etching and/or stamping.

In various embodiments, the chip carrier 102 may include a patterned chip carrier. In various embodiments, the chip carrier 102 may include a slotted chip carrier. In various embodiments, the chip carrier 102 may include a non-patterned chip carrier.

The chip 104 may include any of silicon, germanium, silicon-germanium, gallium arsenide or any other semiconductor materials. The chip contacts (or chip terminals) 106 may include a metal and/or a metal alloy such as e.g. copper, aluminum, gold or any other suitable metals. In addition, the chip contacts (or chip terminals) may include an electrically conductive material. The chip carrier 102 may include copper, aluminum, gold or any other suitable metals. The chip carrier 102 may include a leadframe, a substrate or a circuit board.

In various embodiments, the chip 104 may include a power chip, e.g. a power semiconductor chip. In various embodiments, the at least two chip contacts (or chip terminals) 106, e.g. facing the chip carrier 102, may include a power contact (or power terminal).

In various embodiments, the at least two chip contacts (or chip terminals) 106, e.g. facing the chip carrier 102, may include a plurality of chip contacts (or chip terminals).

In various embodiments, the chip 104 may include a power semiconductor chip such as power metal oxide field effect transistor (MOSFET) or insulated gate bipolar transistor (IGBT). In various embodiments, the chip 104 may include a transistor such as a MOSFET or a bipolar junction transistor (BJT).

In various embodiments, the plurality of chip contacts (or chip terminals) may include a control contact (or control terminal) and a power contact (or power terminal). The control contact (or control terminal) may be referred to as a gate or a base. The power contact (or power terminal) may be referred to as a source or an emitter.

Moreover, the chip 104 may further include at least one further chip contact (or chip terminal) facing away from the chip carrier 102. The at least one further chip contact (or chip terminal) may include a power contact (or power terminal). The power contact (or power terminal) may be referred to as a drain or collector.

The insulating adhesive material 108 may include a polymer matrix material. The electrically insulating adhesive material may electrically isolate each of the plurality of chip contacts (or chip terminals). The electrically insulating adhesive material may provide electrical isolation between chip contacts (or chip terminals) or between the chip contacts (or chip terminals) and the chip carrier 102. The electrically insulating adhesive material may electrically isolate the control contact from the power contact. In other words, the electrically insulating adhesive material may provide electrical isolation between the control contact (control terminal) and the power contact (power terminal). Various embodiments may include an adhesive configured to provide a good and specifically settable electrical insulation between the chip contacts or between the chip contacts and the chip carrier.

In various embodiments, the adhesive may include filler particles. Non-limiting examples of filler particles may include silicon oxide ($SiO_2$), aluminium oxide ($Al_2O_3$) or boron nitride (BN). In various embodiments, the filler material may help to cool the chip 104 during normal operation of the chip 104.

Various embodiments provide for double side cooling.

In various embodiments, the chip arrangement may include at least one isolating structure. In various embodiments, the chip arrangement may include isolating structures to electrically isolate each of the plurality of chip contacts (or chip terminals). In other words, the chip arrangement may further include isolating structures material for providing electrical isolation between chip contacts (or chip terminals) and/or between the chip contacts (or chip terminals) and the chip carrier. The isolating structures may electrically isolate the control contact (control terminal) from the power contact (power terminal). In other words, the isolating structures may provide electrical isolation between the control contact and the power contact. The isolating structures may include isolating foils.

In various embodiments, the at least one isolating structure may be between the chip and the chip carrier. The at least one isolating structure may at least partially cover the at least one chip contact. In various embodiments, the insulating adhesive may not cover the at least two chip contacts. Each of the at least one isolating structure may be deposited as a single continuous layer over a chip contact. In various embodiments, the at least one isolating structure may be on portions of the chip not covered by the chip contact. The at least one isolating structure may at least partially be on the insulating adhesive. Furthermore, the insulating adhesive may at least partially be on the at least one isolating structure.

The at least two chip contacts (or chip terminals) 106 facing the chip carrier 102 may be electrically coupled to the chip carrier 102 by means of at least one contact via through the adhesive 108. The at least one contact via may include electrically conductive material. In various embodiments, the at least one contact via may include a metal and/or a metal alloy. In various embodiments, the at least one contact via may include any one of copper or aluminium. In various embodiments, the at least one contact via may include a conductive material. The contact via may include doped polysilicon.

In various embodiments, the chip arrangement may include encapsulation material disposed at least laterally adjacent to the chip 104. The encapsulation material may be a mold material. The encapsulation material may be disposed at least laterally adjacent to the chip 104 to cover the sidewall of the chip 104. The encapsulation material may be further disposed over the side of the chip 104 facing away from the chip carrier 102.

In various embodiments, the chip 104 may include at least one further chip contact (or chip terminal) facing away from the chip carrier. The chip arrangement may further include a contact hole extending through the encapsulation material laterally disposed of the chip 104 to electrically couple the chip carrier 102 with the further chip contact (or chip terminal) facing away from the chip carrier 102. A contact hole may be also referred to as a through via. A contact hole may include a conductive material. A contact hole may include a metal such as copper or aluminum. The chip arrangement may further include a redistribution structure. The redistribution structure may be configured to electrically couple the further chip contact (or chip terminal) with the contact hole. The redistribution structure may include at least one redistribution layer. A redistribution layer may be a layer including metallization that connects the input/output (I/O) pads of a circuit in the chip 104 to other locations.

The chip arrangement may further include one or more further contact holes extending through the encapsulation material laterally disposed of the chip 104 to electrically couple the chip carrier 102 with the at least one further chip terminal (or chip contact) facing away from the chip carrier 102. Each of the one or more further contact holes may further electrically couple with one of the further chip terminals.

In various embodiments, the chip arrangement may include further chips mounted on the chip carrier 102. The further chips may each include at least two chip contacts (or chip terminals) facing the chip carrier 102. The chip arrangement may further include insulating adhesive 108 between the further chips and the chip carrier 102 to adhere the further chips to the chip carrier 102. The at least two chip contacts (or chip terminals) of each further chip facing the chip carrier 102 may be electrically coupled to the chip carrier 102.

In various embodiments, the chip carrier 102 may include one or more substrates. In various embodiments, the chip carrier 102 may include one or more leadframes.

FIG. 2 is a schematic illustrating a method 200 to manufacture a chip according to various embodiments. In 202, the method may include adhering a chip on a chip carrier, the chip carrier including at least two chip contacts (or chip terminals), e.g. facing the chip carrier, wherein the chip is adhered to the chip carrier by means of insulating adhesive formed between the chip and the chip carrier. Further, in 204, the method may include electrically coupling the at least two chip contacts (or chip terminals), e.g. facing the chip carrier, to the chip carrier.

Various embodiments may remove the need for a temporary substrate as the chip may be directly adhered to the chip carrier.

In various embodiments, adhering the chip on the chip carrier may include covering the at least one chip contact (or chip terminal) with the insulating adhesive.

In various embodiments, the chip carrier may include a leadframe. The leadframe may be a pre-structured leadframe or a post-structured leadframe. In other words, the leadframe may be prefabricated before adhering the chip carrier to the chip or may be formed after adhering the chip carrier to the chip. The post-structured leadframe may be formed by adhering conductive pads to the chip with the insulating adhesive. In various embodiments, the post-structured leadframe may be formed by forming trenches or hollow structures on an non-patterned leadframe, e.g. by means of etching and/or stamping.

In various embodiments, the chip may include a power semiconductor chip. Further, the at least one chip contact (or chip terminal) facing the chip carrier may include a power contact (or power terminal).

In various embodiments, the at least two chip contacts (or chip terminals), e.g. facing the chip carrier, may include a plurality of chip contacts (or chip terminals).

In various embodiments, the chip may include a power semiconductor chip such as power metal oxide field effect transistor (MOSFET) or insulated gate bipolar transistor (IGBT). In various embodiments, the chip may include a transistor such as a MOSFET or a BJT.

In various embodiments, the plurality of chip contacts (or chip terminals) may include a control contact (or control terminal) and a power contact (power terminal). The control contact (control terminal) may be referred to as a gate or a base. The power contact (power terminal) may be referred to as a source or an emitter.

Moreover, the chip may further include at least one further chip contact (or chip terminal) facing away from the chip carrier. The at least one further chip contact (or chip terminal) may include a power contact (or power terminal). The power contact (or power terminal) may be referred to as a drain or collector.

The electrically insulating adhesive material may electrically isolate each of the plurality of chip contacts (or chip terminals). The electrically insulating adhesive material may electrically isolate the control contact (or control terminal) from the power contact (or power terminal).

In various embodiments, the method may further provide forming at least one isolating structure to electrically isolate each of the plurality of chip contacts (or chip terminals). In various embodiments, forming at least one isolating structure may include forming at least one isolating structure to at least partially cover a chip contact. In various embodiments, forming at least one isolating structure may include depositing each of the at least one isolating structure as a continuous layer over each chip contact. In various embodiments, forming at least one isolating structure include forming at least one isolating structure on the chip not covered by a chip contact. In various embodiments, forming at least one isolating structure may include forming at least one isolating structure at least partially on the adhesive material. In various embodiments, forming at least one isolating structure may include forming at least one isolating structure at least partially on the chip.

In various embodiments, the method may further include forming at least one contact via (or electrically conductive structure) through the insulating adhesive. The method may further include electrically coupling the at least one chip contact (or chip terminal) facing the chip carrier to the chip carrier by means of the at least one contact via (or electrically conductive structure) through the adhesive.

In various embodiments, the at least one contact via (or electrically conductive structure) may include electrically conductive material. In various embodiments, the at least one contact via (or electrically conductive structure) may include metal and/or a metal alloy. The at least one contact via (or electrically conductive structure) may include any one of copper or aluminium. In various embodiments, the at least one contact via (or electrically conductive structure) may include a conductive material such as polysilicon.

In various embodiments, the method may further include disposing encapsulation material at least laterally adjacent to the chip. The encapsulation material may be disposed at least laterally adjacent to the chip to cover the sidewalls of the chip.

The encapsulation material may be further disposed over the side of the chip facing away from the chip carrier.

In various embodiments, the chip may further include at least one further chip contact (or chip terminal) facing away from the chip carrier. The method may further include forming a contact hole extending through the encapsulation material laterally disposed of the chip to electrically couple the chip carrier with the further chip contact (or chip terminal) facing away from the chip carrier. Moreover, forming the contact hole may involve forming a through hole. Forming the contact hole may further include depositing metal or a conductive material in the through hole.

The method may include forming subsequent contact holes extending through the encapsulation material disposed of the chip to electrically couple the chip carrier with the at least one further chip contact (or chip terminals) facing away from the chip carrier. Each of the one or more further contact holes may further electrically couple with one of the further chip contacts (or chip terminals).

In various embodiments, the method may further include forming a redistribution structure configured to electrically couple the further chip contact (or chip terminal) with the contact hole. The redistribution structure may include at least one redistribution layer.

Figure 3:
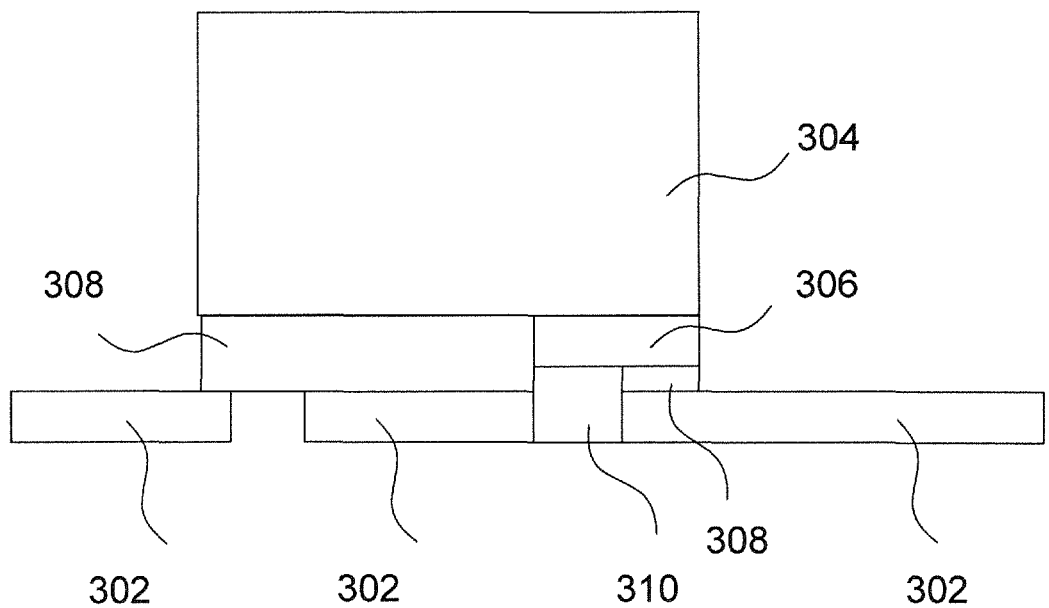
FIG. 3 shows a schematic illustrating a cross-sectional side view of a chip arrangement according to various embodiments.

FIG. 3 is a schematic 300 illustrating a cross-sectional side view of a chip arrangement according to various embodiments. The chip arrangement may include a chip carrier 302 and a chip 304 including at least two chip terminals (or chip contacts) 306. The chip 304 may be supported by the chip carrier 302 such that the at least two chip terminals (or chip contacts) 306 may face the chip carrier 302. The chip arrangement may further provide an insulating adhesive 308 between the chip 304 and the chip carrier 302 to adhere the chip 304 to the chip carrier 302. The chip arrangement may further provide at least one electrically conductive structure 310 extending through the adhesive 308 so that the at least two chip terminals 306 are electrically coupled to the chip carrier 302.

In various embodiments, the insulating adhesive 308 may partially cover the at least two chip terminals (or chip contacts) 306.

In various embodiments, the chip carrier 302 may include a leadframe. The leadframe may be a pre-structured leadframe or a post-structured leadframe. In other words, the leadframe may be prefabricated before adhering the chip carrier 302 to the chip 304 or may be formed after adhering the chip carrier 302 to the chip 304. The post-structured leadframe may be formed by adhering conductive pads to the chip 304 with the insulating adhesive 308. In various embodiments, the post-structred leadframe may be formed by forming trenches or hollow structures on an non-patterned leadframe. The leadframe may be structured by means of etching and/or stamping.

In various embodiments, the chip carrier 302 may include a patterned chip carrier. In various embodiments, the chip carrier 302 may include a slotted chip carrier. The chip carrier 302 may include a non-patterned chip carrier.

The chip 304 may include any of silicon, germanium, silicon-germanium, gallium arsenide or any other semiconductor materials. The chip terminals (or chip contacts) 302 may include a metal and/or a metal alloy such as e.g. copper, aluminum, gold or any other suitable metals. The chip terminals (or chip contacts) 302 may include an electrically conductive material. The chip carrier 302 may include copper, aluminum, gold or any other suitable metal and/or metal alloy. The chip carrier 102 may include a leadframe, a substrate or a circuit board.

In various embodiments, the chip 304 may include a power semiconductor chip. In various embodiments, the at least two chip terminals (or chip contacts) 306, e.g. facing the chip carrier 302 may include a power terminal (or power contact).

In various embodiments, the at least two chip terminals (or chip contacts) 306, e.g. facing the chip carrier 302, may include a plurality of chip terminals (or chip contacts).

In various embodiments, the chip 304 may include a power semiconductor chip such as power metal oxide field effect transistor (MOSFET) or insulated gate bipolar transistor (IGBT). In various embodiments, the chip 304 may include a transistor such as a MOSFET or BJT.

In various embodiments, the plurality of chip contacts (or chip terminals) may include a control terminal (or control contact) and a power terminal (or power contact). The control terminal (or control contact) may be referred to as a gate or a base. The power terminal (or power contact) may be referred to as a source or an emitter.

Moreover, the chip 304 may further include at least one further chip terminal (or chip contact) facing away from the chip carrier 302. The at least one further chip terminal (or chip) contact may include a power terminal (or power contact). The power terminal (or power contact) may be referred to as a drain or collector.

The electrically insulating adhesive material 308 may include a polymer matrix material. The electrically insulating adhesive material may electrically isolate each of the plurality of chip terminals (or chip contacts). In other words, the electrically insulating adhesive material may provide electrical isolation between the chip terminals (or chip contacts). The electrically insulating adhesive material may provide electrical isolation between chip terminals (or chip contacts) or between the chip terminals (or chip contacts) and the chip carrier 302. The electrically insulating adhesive material may electrically isolate the control terminal (or control contact) from the power terminal (or power contact). In other words, the electrically insulating adhesive material may provide electrical isolation between the control terminal (or control contact) and the power terminal (or power contact).

In various embodiments, the adhesive may include filler particles. Non-limiting examples of filler particles may include silicon oxide ($SiO_2$), aluminium oxide ($Al_2O_3$) or boron nitride (BN).

In various embodiments, the chip arrangement may include at least one isolating structure. In various embodiments, the chip arrangement may include isolating structures to electrically isolate each of the plurality of chip terminals (or chip contacts). In other words, the chip arrangement may further include isolating structures for providing electrical isolation between chip terminals (or chip contacts) and/or between the chip terminals (or chip contacts) and the chip carrier. The isolating structures may electrically isolate the control terminal (or control contact) from the power terminal (or power contact). In other words, the isolating structures may provide electrical isolation between the control terminal (control contact) and the power terminal (power contact). The isolating structures may include isolating foils.

In various embodiments, the at least one isolating structure may be between the chip and the chip carrier. In various embodiments, the at least one isolating structure may partially cover the at least two chip terminals (or chip contacts). In various embodiments, the insulating adhesive may not cover the at least one chip terminal (or chip contact). The at least one isolating structure may be deposited as a single continuous layer over a chip terminal (or chip contact). The at least one isolating structure may be on portions of the chip not covered by the chip contact. The at least one isolating structure may at least partially be on the insulating adhesive. The insulating adhesive may at least partially be on the at least one isolating structure.

In various embodiments, the at least one electrically conductive structure 310 may include at least one contact via. The at least one contact via may include electrically conductive material. The at least one contact via may include metal and/or a metal alloy. In various embodiments, the at least one contact via may include any one of copper or aluminium.

In various embodiments, the chip arrangement may include encapsulation material disposed at least laterally adjacent to the chip 304. The encapsulation material may be a mold material. The encapsulation material may be disposed at least laterally adjacent to the chip 304 to cover the sidewall of the chip 304. The encapsulation material may be further disposed over the side of the chip 304 facing away from the chip carrier 302.

In various embodiments, the chip 304 may further include at least one further chip terminal (or chip contact) facing away from the chip carrier 302. The chip arrangement may further include a contact hole extending through the encapsulation material laterally disposed of the chip 304 to electrically couple the chip carrier 302 with the further chip terminal (or chip contact) facing away from the chip carrier 302. A contact hole may be also referred to as a through via. A contact hole may include a conductive material. A contact hole may include a metal and/or a metal alloy such as copper or aluminum.

The chip arrangement may include one or more further contact holes extending through the encapsulation material laterally disposed of the chip 304 to electrically couple the chip carrier 302 with the at least one further chip terminal (or chip contact) facing away from the chip carrier 302. Each of the one or more further contact holes may further electrically couple with one of the further chip terminals (or chip contacts).

The chip arrangement may further provide a redistribution structure configured to electrically couple the further chip terminal (or chip contact) with the contact hole. The redistribution structure may include at least one redistribution layer. A redistribution layer may be a layer including metallization that connects the input output pads of a circuit in the chip 304 to other locations.

In various embodiments, the chip arrangement may include further chips supported by the chip carrier 302. The further chips may each include at least one chip terminal (or chip contact) facing the chip carrier 302. The chip arrangement may further include insulating adhesive 308 between the further chips and the chip carrier 302 to adhere the further chips to the chip carrier 302. Each of the further chips may also include at least one electrically conductive structure extending through the insulating adhesive 308 so that the at least one chip terminal (or chip contact) is electrically coupled to the chip carrier 302.

In various embodiments, the chip carrier 302 may include one or more substrates. In various embodiments, the chip carrier 302 may include one or more leadframes.

Figure 4A:
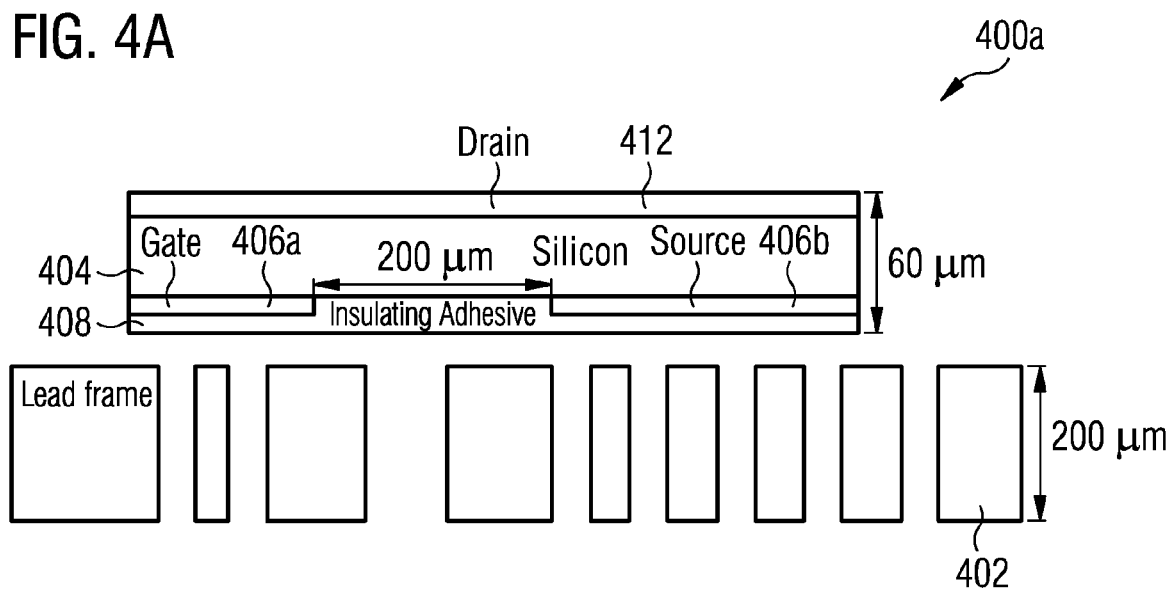

FIGS. 4A to E shows a method to manufacture a chip arrangement according to various embodiments. The values shown are for illustration only and are not intended to be limiting. FIG. 4A shows a schematic 400a of a chip 404 with a plurality of chip contacts (or chip terminals) 406a, 406b being adhered to chip carrier 402 according to various embodiments. The chip carrier 402 may include a patterned chip carrier or a slotted chip carrier. The plurality of chip contacts (or chip terminals) 406a, 406b faces the chip carrier 402. The chip 404 may be a metal oxide field effect transistor (MOSFET). One of the plurality of chip contacts (or chip terminals) 406a may include a gate. Another of the plurality of chip contacts 404b may include a source. The chip 404 may include at least one further chip contact (or chip terminal) 412 facing away from the chip carrier 404. The further chip contact (or chip terminal) 412 may include a drain. However, the chip contacts may be interchangeable. For instance, in various alternative embodiments, the chip contact 406b may be taken to be the drain, the further chip contact 412 may be taken to be the source. In various embodiments, the chip contact 406a may be taken as the drain or source and any of chip contact 406b or further chip contact 412 may be taken as the gate.

The chip 404 may be adhered to the chip carrier 402 using an adhesive 408 such as a electrically insulating adhesive material. The adhesive 408 may include filler materials. Alternatively, the insulating adhesive 408 may not include filler materials, in other words may be free of filler materials. Examples of filler materials may include $SiO_2$, $Al_2O_3$ or BN. The adhesive 408 may be applied such that the plurality of chip contacts 406a, 406b are fully or at least partially covered. In various embodiments, the adhesive material may range from about 1 μm to about 100 μm, e.g. about 5 μm to about 50 μm, e.g. about 20 μm to about 30 μm. In various embodiments, the chip carrier 402 may have a thickness ranging from about 50 μm to about 500 μm, e.g. about 200 μm. In various embodiments, the chip 402 and adhesive 408 may have a total thickness in the range from about 30 μm to about 100 μm, e.g. about 60 μm. The distance between the source and gate may for instance range from 50 μm to 300 μm, e.g. about 200 μm. Various embodiments may provide a method in which the thickness of the adhesive 408 may be set accurately. The accurate setting of the thickness of the adhesive 408 may result in a more controllable dielectric strength.

The chip carrier 402 may be a leadframe. The width of each lead or pin in the leadframe may be more than about 100 μm. The distance between the leads or pins of the leadframe may be from about 100 μm to about 200 μm.

Figure 4B:
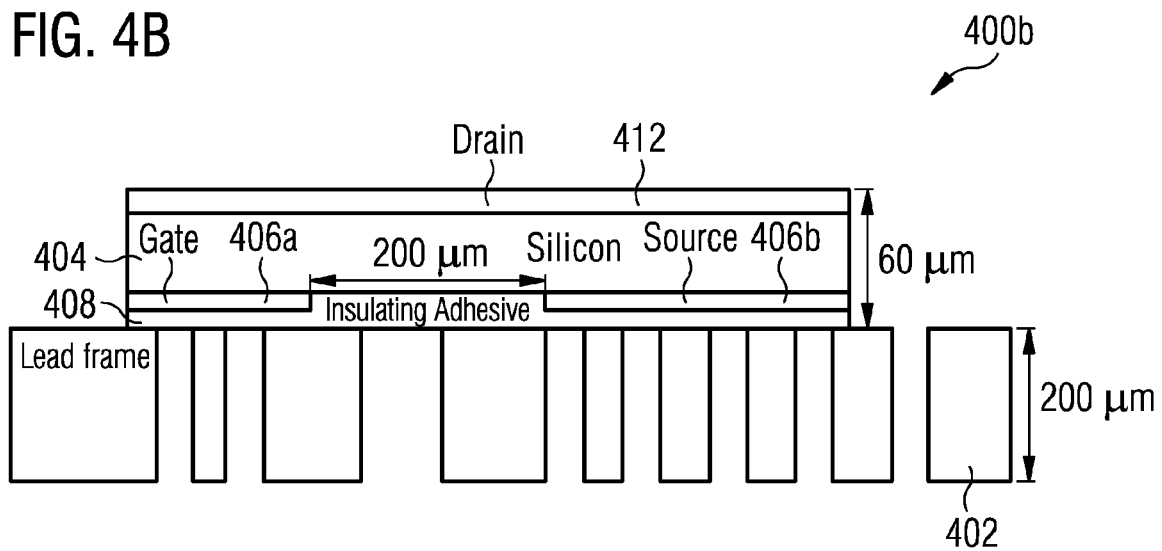

FIG. 4B shows a schematic 400b of a chip arrangement including a chip carrier 402 and a chip 404 mounted on the chip carrier 402 according to various embodiments. The chip 404 may be bonded on the chip carrier 402 using the adhesive. The chip 404 may be bonded on the chip carrier 402 under elevated temperatures and pressures. The temperatures for bonding may range from about 100° C. to about 250° C.

It may also be envisioned that the chip 404 may be adhered to the chip carrier 402 with the further chip contact 412 (i.e. the drain) facing the chip carrier 402. The further chip contact 412 may be covered at least partially by the adhesive 408. The chip contacts 406a, 406b may face away from the chip carrier 402.

Figure 4C:
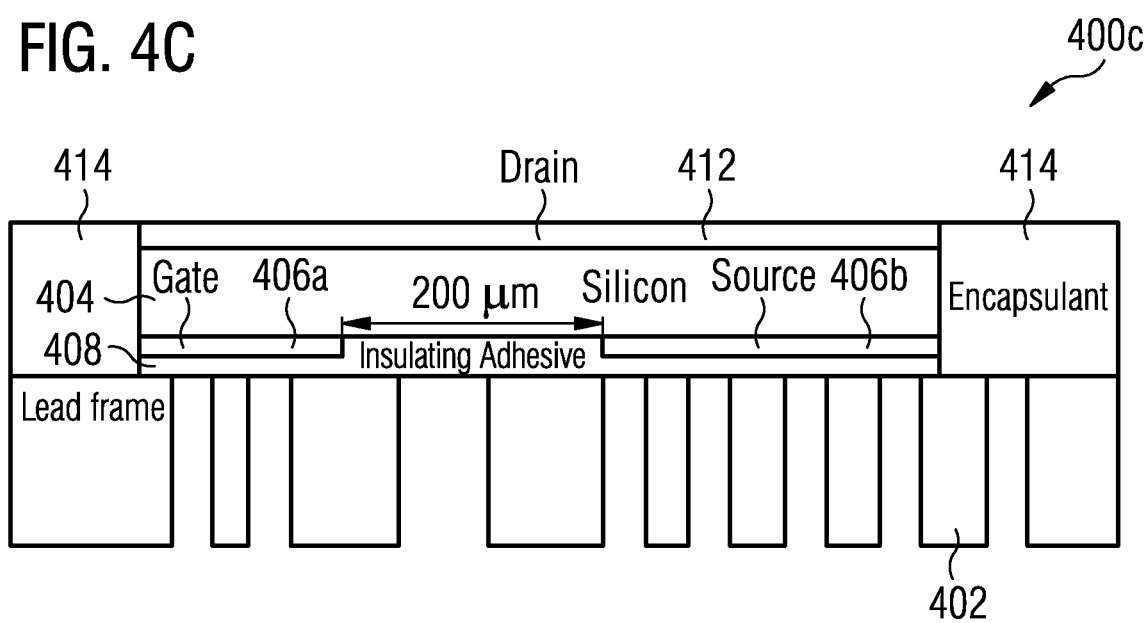

FIG. 4C shows a schematic 400c of a chip arrangement including encapsulation material 414 disposed at least laterally to the chip 404 according to various embodiments. In various embodiments, a method is provided which may include disposing encapsulation material 414 at least laterally to the chip 404. The encapsulation material may include a mold material. In various embodiments, the encapsulation material 414 may be disposed at least laterally adjacent to the chip 404 to cover the sidewalls of the chip 404. Disposing encapsulation material 414 may include using a lamination foil.

FIG. 4D shows a schematic 400d of a chip arrangement including a through hole 416 extending through the encapsulation material 414 according to various embodiments. In various embodiments, forming a contact hole extending through the encapsulating material may include forming the through hole 416 through the encapsulation material 414. Forming the through hole may include drilling. Drilling may include laser drilling. Forming the through hole may include etching. Forming the through hole 416 may include a combination of drilling and etching.

Figure 4E:
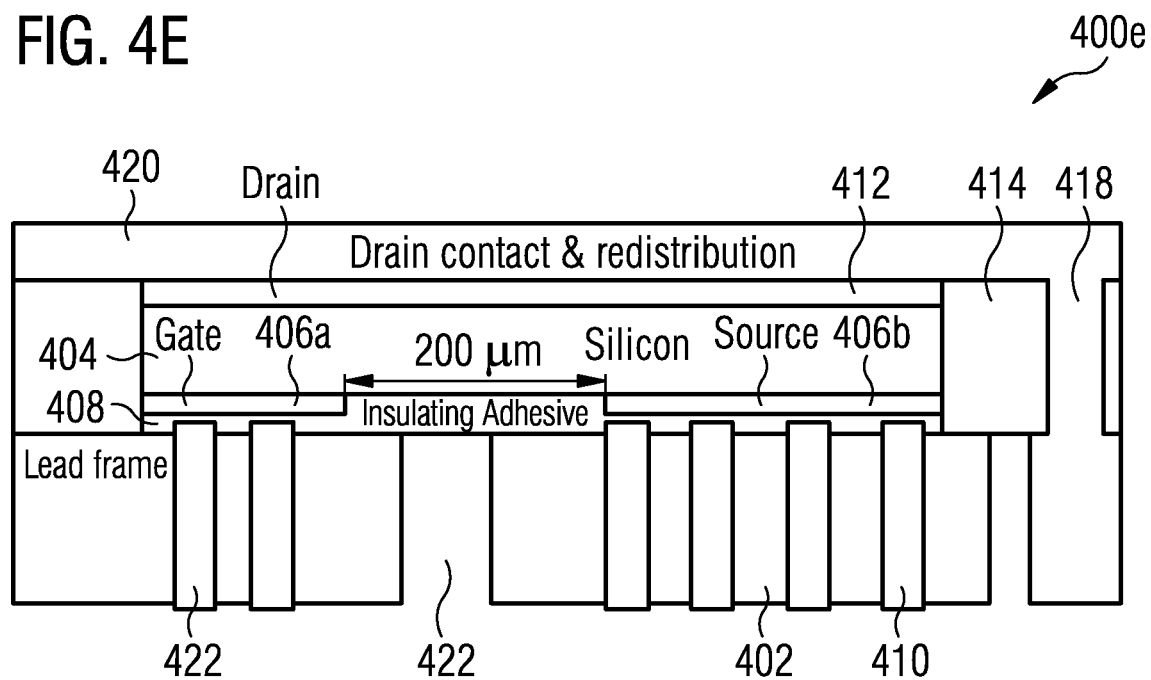

FIG. 4E shows a schematic 400e of a chip arrangement including at least a contact hole according to various embodiments. In various embodiments, forming a contact hole 418 extending through the encapsulating material 414 may include deposition of metal. The deposition of metal include any of galvanic filling, electrolytic deposition, electroless deposition and chemical vapour deposition (CVD). In various embodiments, forming a contact hole 418 extending through the encapsulating material 414 may include deposition of metal in the through hole 416 after forming the through hole 416. Forming a contact hole 418 may include deposition of a conductive material in the through hole 416 after forming the through hole 416. In various embodiments, forming at least one conductive structure 410 may include deposition of metal. The deposition of metal include any of galvanic filling, electrolytic deposition, electroless deposition and chemical vapour deposition (CVD). In various embodiments, forming at least one conductive structure 410 may include deposition of a conductive material. In various embodiments, the method may provide removing at least a portion of the adhesive covering the at least one chip contact (or chip terminal). In various embodiments, the method may provide removing at least a portion of the adhesive covering the at least one chip contact (or chip terminal) before depositing metal (or conductive material). In various embodiments, the method may provide forming at least one hollow structure or trench 422. In various embodiments, forming the at least one hollow structure or trench 422 may include selectively masking at least one portion of the chip frame before deposition of metal (or conductive material) to form the hollow structure or trench 422. In various embodiments, the method may provide forming a redistribution structure 420 configured to electrically couple the further chip contact 412 with the contact hole 416. In various embodiments, forming the redistribution structure 420 may include deposition of metal or conductive material. The deposition of metal may include any of galvanic filling, electrolytic deposition, electroless deposition and chemical vapour deposition (CVD). In various embodiments, depositing metal (or conductive material) may at the same time form one or more of the following: the redistribution layer 420, the contact hole 416 and at least one conductive structure 410. In various embodiments, other conductive materials such as doped poly silicon may be used instead of metal. The depositing of conductive material may include CVD.

In various embodiments, the chip arrangement may include at least one isolating structure. In various embodiments, the at least isolating structure may be between the chip 404 and the chip carrier 406. In various embodiments, the at least one isolating structure may at least partially cover any of the at least one chip contact 406a, 406b. In various embodiments, the adhesive 408 may not cover the at least one chip contact 406a, 406b. In various embodiments, the at least one isolating structure may be deposited as a single continuous layer over any of the at least one chip contact 406a and 406b. At least one portion of each isolating structure may be removed before deposition of metal (or conductive material). In various embodiments, the at least one isolating structure may be on portions of the chip 404 not covered by the chip contact 406a and 406b. In various embodiments, the at least one isolating structure may at least partially be on the insulating adhesive 408. In various embodiments, the insulating adhesive 408 may at least partially be on the at least one isolating structure.

Figure 5:
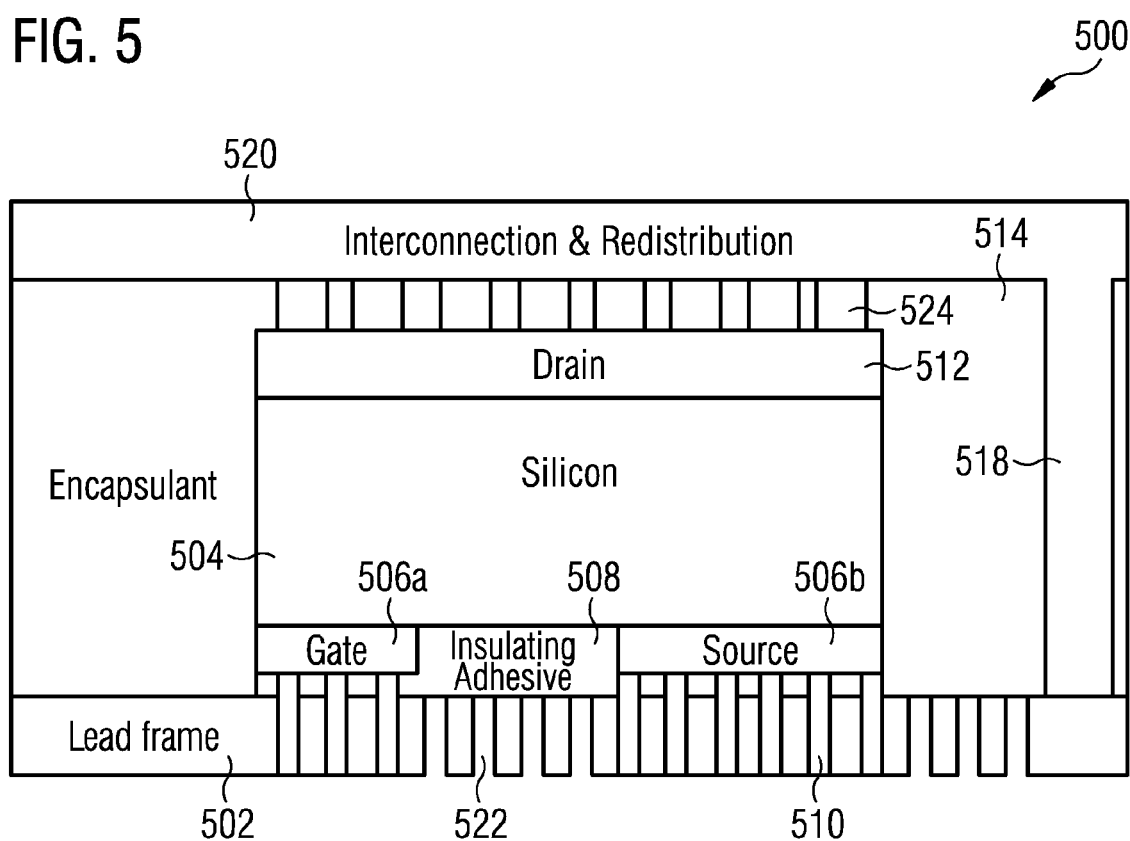
FIG. 5 shows a schematic illustrating a cross-sectional side view of a chip arrangement according to various embodiments.

FIG. 5 is a schematic 500 illustrating a cross-sectional side view of a chip arrangement according to various embodiments. The chip arrangement may include a chip carrier 502 and a chip 504 mounted on the chip carrier 502. The chip 504 may include at least one chip contact (or chip terminal) 506a, 506b facing the chip carrier 504 and an adhesive 508 between the chip 504 and the chip carrier 502 to adhere the chip 504 to the chip carrier 502. The at least one chip contact (or chip terminal) 506a, 506b facing the chip carrier 502 may be electrically coupled to the chip carrier 502. The at least one chip contact 506a, 506b facing the chip carrier 502 may be electrically coupled to the chip carrier by means of at least one contact via (or electrically conductive structure) 510 through the adhesive 508. Further, the chip arrangement includes at least one further chip contact (or chip terminal) 512 facing away from the chip carrier 502. The chip arrangement may also include encapsulation material 514 disposed laterally adjacent to the chip 504 to cover the sidewalls of the chip 504. Further, the encapsulation material 514 may be disposed over the side of the chip 504 facing away from the chip carrier 502. In other words, the chip 504 may be completely encapsulated (e.g. molded). The chip arrangement may further include a contact hole 518 extending through the encapsulation material 514 laterally disposed of the chip 504 to electrically couple the chip carrier 502 with the at least one further chip contact (or chip terminal) 512. The chip arrangement may also include a redistribution structure 520 configured to electrically couple the at least one further chip contact 512 with the contact hole 518. In addition, the at least one further chip contact 512 may be electrically coupled to the redistribution structure 520 by means of at least one further contact via (or electrically conductive structure) 524 through the encapsulation material 514 (i.e. the encapsulation material 514 disposed over the side of the chip 504 facing away from the chip carrier 502). In other words, the contact hole 518 may be electrically coupled to the further chip contact 512 by means of at least one further contact via (or electrically conductive structure) 524 and the redistribution structure 520.

In various embodiments, the chip arrangement may include a chip carrier 502 and a chip 504 including at least two chip terminals (or chip contacts) 506. The chip 504 may be supported by the chip carrier 502 such that the at least two chip terminals (or chip contacts) 506a, 506b may face the chip carrier 502. The chip arrangement may further provide an insulating adhesive 508 between the chip 504 and the chip carrier 502 to adhere the chip 504 to the chip carrier 502. The chip arrangement may further provide at least one electrically conductive structure 510 extending through the insulating adhesive 508 so that the at least two chip terminals (or chip contacts) 306 are electrically coupled to the chip carrier 502. Further, the chip arrangement includes at least one further chip terminal (or chip contact) 512 facing away from the chip carrier 502. The chip arrangement may also include encapsulation material 514 disposed laterally adjacent to the chip 504 to cover at least one sidewall of the chip 504. Further, the encapsulation material 514 may be disposed over the side of the chip 504 facing away from the chip carrier 502. In other words, the chip 504 may be completely encapsulated by the encapsulation material 514 and the insulating adhesive 508. The chip arrangement may further include a contact hole 518 extending through the encapsulation material 514 laterally disposed of the chip 504 to electrically couple the chip carrier 502 with the at least one further chip contact (or chip terminal) 512. The chip arrangement may also include a redistribution structure 520 configured to electrically couple the further chip contact 512 with the contact hole 518. In addition, the chip arrangement may include at least one further electrically conductive structure 524 extending through the encapsulation material 514 (i.e. the encapsulation material 514 disposed over the side of the chip 504 facing away from the chip carrier 502) so that at the at least one further chip terminal (or chip contact) 512 is electrically coupled to the redistribution structure 520. In other words, the contact hole 518 may be electrically coupled to the further chip contact 512 by means of at least one further electrically conductive structure 524 and the redistribution structure 520.

Figure 6A:
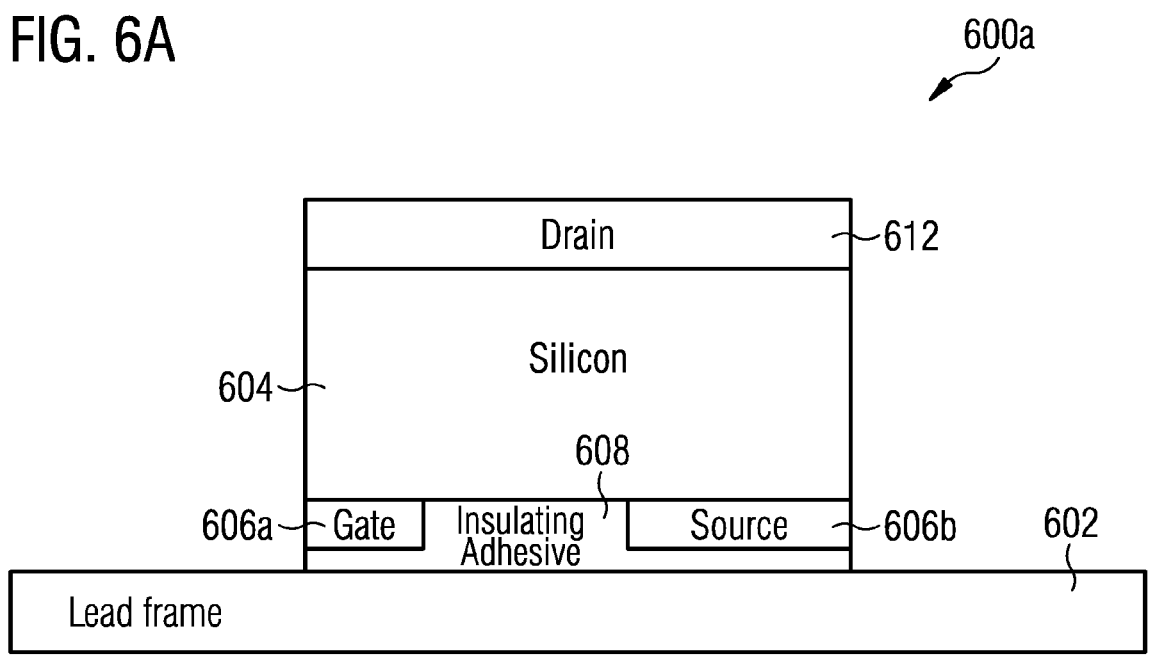
Figure 6B:
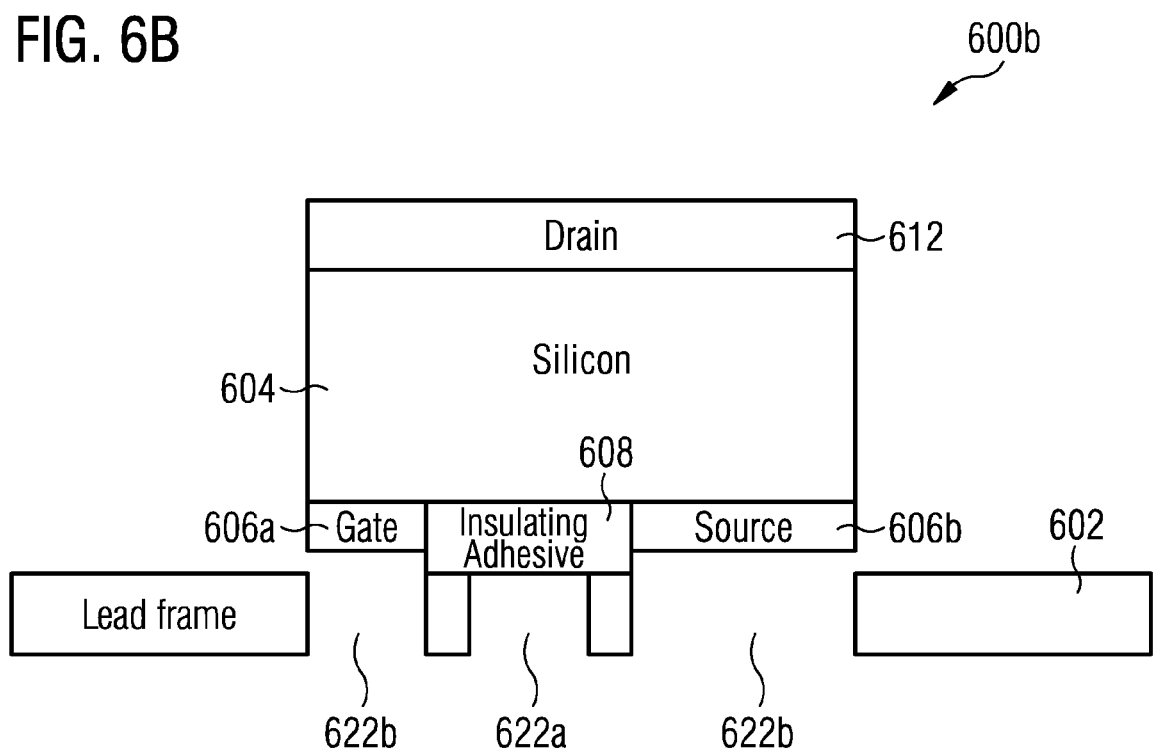
Figure 6C:
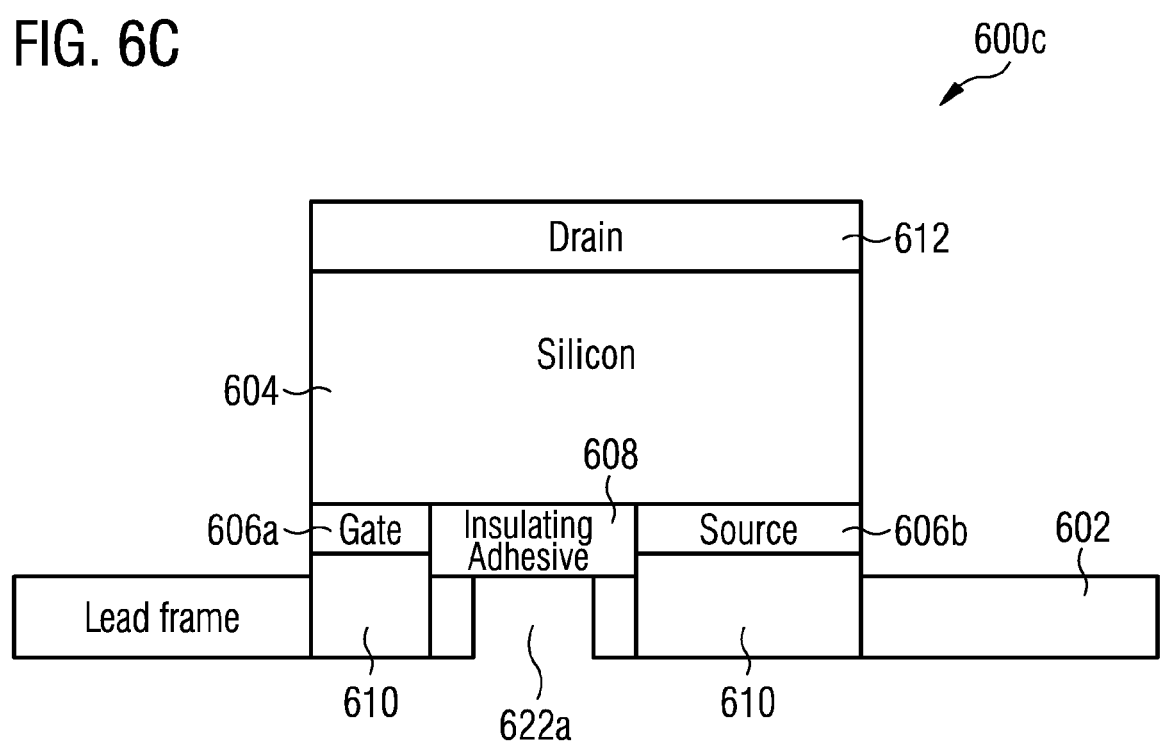

FIGS. 6A to C shows a method to manufacture a chip arrangement according to various embodiments. FIG. 6A shows a schematic 600a of a chip 604 with a plurality of chip contacts (or chip terminals) 606a, 606b being adhered to chip carrier 602 according to various embodiments. The chip carrier 602 may include a non-patterned chip carrier. The plurality of chip contacts (or chip terminals) 606a, 606b faces the chip carrier 602. The chip 604 may be a metal oxide field effect transistor (MOSFET). One of the plurality of chip contacts (or chip terminals) 606a may include a gate. Another chip contact of the plurality of chip contacts 604b may include a source. The chip 604 may include at least one further chip contact (or chip terminal) 612 facing away from the chip carrier 604. The further chip contact (or chip terminal) 612 may include a drain. However, the chip contacts may be interchangeable. For instance, in various embodiments, the chip contact 606b may be taken to be the drain, the further chip contact 612 may be taken to be the source. In various embodiments, the chip contact 606a may be taken as the drain or source and any of chip contact 606b or further chip contact 612 may be taken as the gate.

The chip 604 may be adhered to the chip carrier 602 using an (electrically) insulating adhesive 608. The insulating adhesive 608 may include filler materials. Alternatively, the insulating adhesive 608 may not include filler materials. Examples of filler materials may include $SiO_2$, $Al_2O_3$ or BN. The insulating adhesive 608 may be applied such that the plurality of chip contacts 606a, 606b are fully or at least partially covered.

FIG. 6B shows a schematic 600b of a chip arrangement after patterning is carried out on the chip arrangement according to various embodiments. The method may further provide patterning the chip carrier 602. In various embodiments, patterning the chip carrier 602 include patterning the chip carrier 602 after the chip 604 is adhered to the chip carrier 602. Patterning the chip carrier 602 may include forming at least one hollow structure or trench 622a, 622b on the chip carrier 602. In various embodiments, patterning the chip carrier 602 may include forming at least one hollow structure or trench 622a, 622b on at least a portion of the chip carrier 602 over the at least two chip contacts 606a, 606b. In various embodiments, the method may further provide patterning the adhesive 608. Patterning the adhesive 608 may include removing portions of the insulating adhesive 608 over the portions of the chip carrier 602 removed to form at least one hollow structure or trench 622a, 622b. In various embodiments, patterning the insulating adhesive 608 may include removing at least a portion of the insulating adhesive 608 over the at least two chip contacts 606a, 606b.

FIG. 6C shows a schematic 600c of a chip arrangement after deposition of metal (or conductive material) according to various embodiments. The method may further provide selectively masking or covering at least some of the hollow structures or trenches 622a. The method may provide selectively masking or covering at least some of the hollow structures or trenches 622a before depositing the metal (or conductive material). The method may further provide depositing metal (or conductive material) such that hollow structures or trenches 622b are filled to form at least one contact via (or electrically conductive structure). The depositing of metal may include any of galvanic filling, electrolytic deposition, electroless deposition and chemical vapour deposition (CVD). The depositing of conductive material may include CVD.

The method may further provide further processing such as encapsulation, forming of a redistributed structure and/or forming of further contact vias (or electrically conductive structures) which may be described above.

Figure 7A:
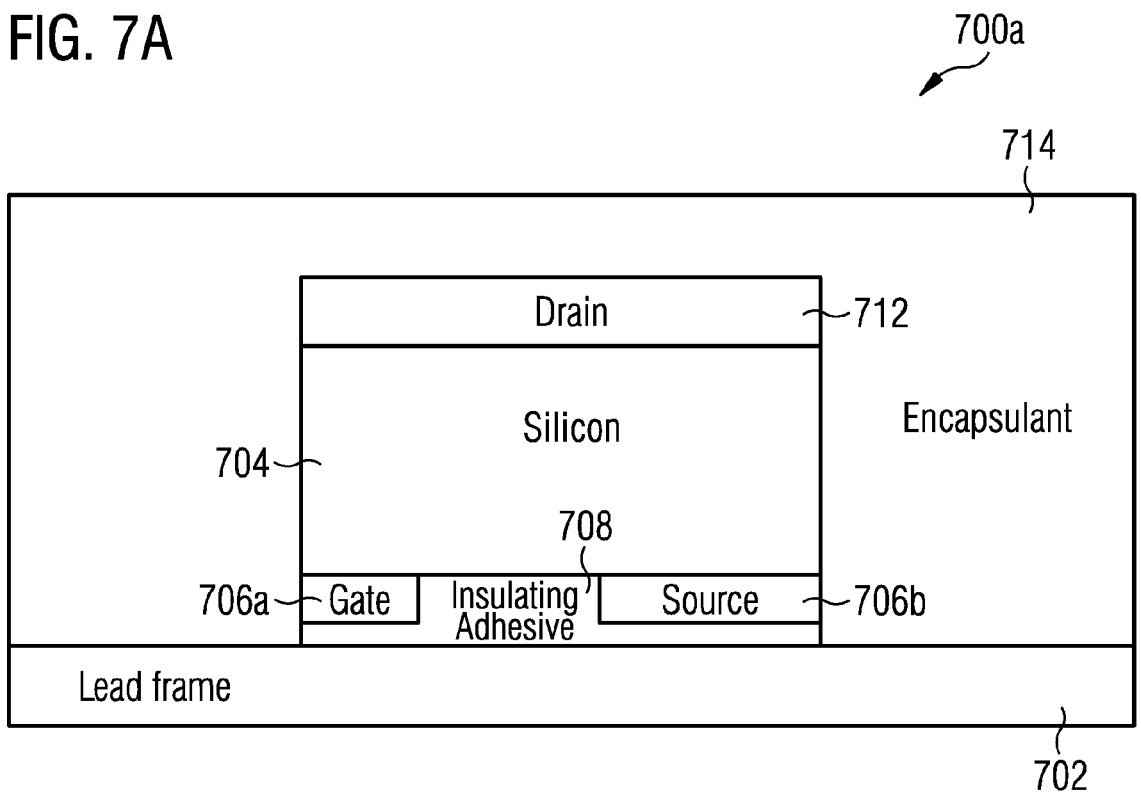
Figure 7B:
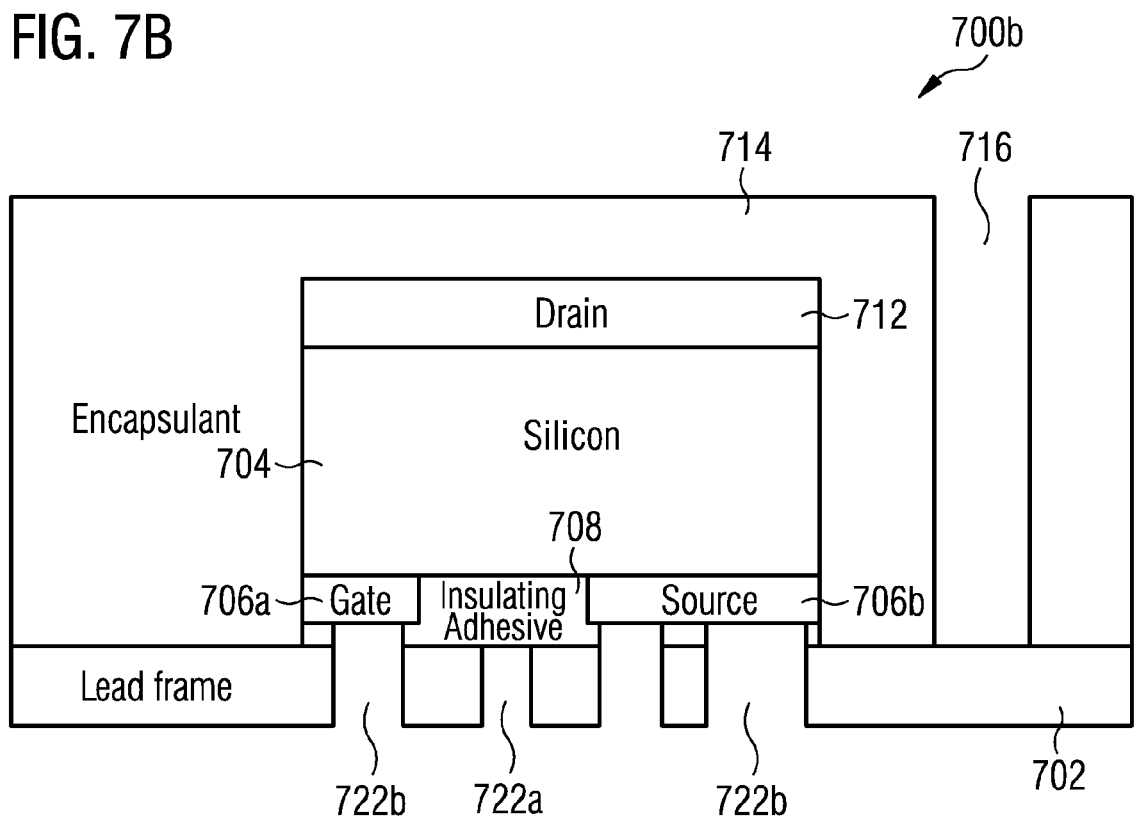

FIGS. 7A and 7B shows a method to manufacture a chip arrangement according to various embodiments. FIG. 7A shows a schematic 700a of a chip 704 with a plurality of chip contacts (or chip terminals) 706a, 706b being adhered to chip carrier 702 according to various embodiments. The chip carrier 702 may include a non-patterned chip carrier. The plurality of chip contacts (or chip terminals) 706a, 706b may face the chip carrier 702. The chip 704 may be a metal oxide field effect transistor (MOSFET). One of the plurality of chip contacts (or chip terminals) 706a may include a gate. Another of the plurality of chip contacts 704b may include a source. The chip 704 may include at least one further chip contact (or chip terminal) 712 facing away from the chip carrier 604. The further chip contact (or chip terminal) 712 may include a drain. However, the chip contacts may be interchangeable. For instance, in various embodiments, the chip contact 706b may be taken to be the drain, the further chip contact 712 may be taken to be the source. In various embodiments, the chip contact 706a may be taken as the drain or source and any of chip contact 706b or further chip contact 712 may be taken as the gate.

The chip 704 may be adhered to the chip carrier 702 using an adhesive 708 such as a electrically insulating adhesive material. The adhesive 708 may include filler materials. Alternatively, the adhesive 708 may not include filler materials. Examples of filler materials may include $SiO_2$, $Al_2O_3$ or BN. The adhesive 708 may be applied such that the plurality of chip contacts 706a, 706b are fully or at least partially covered. The method may further include disposing encapsulation material 714 at least laterally adjacent to the chip 704 to cover the sidewalls of the chip 704. The method may further include disposing encapsulation material 714 over the side of the chip 704 facing away from the chip carrier.

FIG. 7B shows a schematic 700b of a chip arrangement including forming a through hole 716 extending through the encapsulation material 714 according to various embodiments. In various embodiments, forming a contact hole extending through the encapsulating material may include forming the through hole 716. Forming the through hole may include drilling. Drilling may include laser drilling. Forming the through hole may include etching. Forming the through hole 716 may include a combination of drilling and etching.

The method may further provide patterning the chip carrier 702. In various embodiments, patterning the chip carrier 702 include patterning the chip carrier 702 after the chip 704 is adhered to the chip carrier 702. Patterning the chip carrier 702 may include forming at least one hollow structure or trench 722a, 722b on the chip carrier 702. In various embodiments, patterning the chip carrier 702 may include forming at least one hollow structure or trench 722a, 722b on the chip carrier on at least a portion of the chip carrier 702 over the at least one chip contacts 706a, 706b. In various embodiments, the method may further provide patterning the adhesive 708. Patterning the adhesive 708 may include removing portions of the adhesive 708 over the portions of the chip carrier 702 removed to form at least one hollow structure or trench 722a, 722b. In various embodiments, patterning the adhesive 708 may include removing at least a portion of the adhesive 708 over the at least two chip contacts 706a, 706b.

The method may further provide deposition of metal (or conductive material). The method may also provide selectively masking or covering at least some of the hollow structures or trenches before depositing the metal (or conductive material). The method may further provide depositing metal (or conductive material) such that hollow structures or trenches (that are not masked or covered) are filled to form at least one contact via (or electrically conductive structure). The method may further provide further processing such as encapsulation, forming of a redistributed structure and/or forming of further contact vias (or electrically conductive structures) which may be described above.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. A chip arrangement, comprising:
a chip carrier;
a chip mounted on the chip carrier, the chip comprising at least two chip contacts facing the chip carrier;
an insulating adhesive between the chip and the chip carrier to adhere the chip to the chip carrier; and
an encapsulation material disposed at least laterally adjacent to the chip;
wherein the insulating adhesive partially covers the at least two chip contacts;
wherein the at least two chip contacts are electrically coupled to the chip carrier.

2. The chip arrangement of claim 1,
wherein the chip comprises a power semiconductor chip; and
wherein the at least one chip contact facing the chip carrier comprises a power contact.

3. The chip arrangement of claim 1,
wherein the chip comprises a power semiconductor chip; and
wherein the plurality of chip contacts comprises a control contact and a power contact.

4. The chip arrangement of claim 1,
wherein the chip further comprises at least one further chip contact facing away from the chip carrier.

5. The chip arrangement of claim 1,
wherein the at least two chip contacts are electrically coupled to the chip carrier by means of at least one contact via through the insulating adhesive.

6. The chip arrangement of claim 1,
wherein the encapsulation material is disposed at least laterally adjacent to the chip to cover the sidewalls of the chip.

7. The chip arrangement of claim 6,
wherein the chip further comprises at least one further chip contact facing away from the chip carrier;
wherein the chip arrangement further comprises a contact hole extending through the encapsulation material laterally disposed of the chip to electrically couple the chip carrier with the further chip contact facing away from the chip carrier.

8. The chip arrangement of claim 7, further comprising:
a redistribution structure configured to electrically couple the further chip contact with the contact hole.

9. The chip arrangement of claim 8,
wherein the redistribution structure comprises at least one redistribution layer.

10. A method for manufacturing a chip arrangement, the method comprising:
adhering a chip on a chip carrier, the chip comprising at least two chip contacts,
wherein the chip is adhered to the chip carrier by means of an insulating adhesive formed between the chip and the chip carrier;
wherein adhering the chip on the chip carrier comprises partially covering the at least two chip contacts with the insulating adhesive;
electrically coupling the at least two chip contacts to the chip carrier; and
depositing an encapsulation material at least laterally adjacent to the chip.

11. The method of claim 10,
wherein the chip comprises a power semiconductor chip; and
wherein the at least two chip contacts comprise a power contact.

12. The method of claim 10, further comprising:
forming at least one contact via through the adhesive;
electrically coupling the at least one chip contact facing the chip carrier to the chip carrier by means of the at least one contact via through the adhesive.

13. A chip arrangement, comprising:
a chip carrier;
a chip comprising at least two chip terminals, wherein the chip is supported by the chip carrier such that the at least two chip terminals are facing the chip carrier; and
an insulating adhesive between the chip and the chip carrier to adhere the chip to the chip carrier, wherein the insulating adhesive partially covers the at least two chip terminals;
an encapsulation material at least laterally adjacent to the chip; and
at least one electrically conductive structure extending through the insulating adhesive so that the at least two chip terminals are electrically coupled to the chip carrier.

14. The chip arrangement of claim 13,
wherein the chip comprises a power semiconductor chip; and
wherein the at least two chip terminals facing the chip carrier comprise a power terminal.

15. The chip arrangement of claim 13,
wherein the at least one electrically conductive structure comprises at least one contact via.

16. The chip arrangement of claim 13, further comprising:
an encapsulation material disposed at least laterally adjacent to the chip.

17. The chip arrangement of claim 16,
wherein the encapsulation material is disposed at least laterally adjacent to the chip to cover at least one sidewall of the chip.

18. The chip arrangement of claim 17,
wherein the encapsulation material is further disposed over the side of the chip facing away from the chip carrier.

19. A chip arrangement, comprising:
a chip carrier;

a chip comprising at least two chip terminals, wherein the chip is supported by the chip carrier such that the at least two chip terminals are facing the chip carrier; and an insulating adhesive between the chip and the chip carrier to adhere the chip to the chip carrier;

at least one electrically conductive structure extending through the insulating adhesive so that the at least two chip terminals are electrically coupled to the chip carrier;

wherein the chip further comprises at least one further chip terminal facing away from the chip carrier;

wherein the chip arrangement further comprises a contact hole extending through the encapsulation material laterally disposed of the chip to electrically couple the chip carrier with the further chip terminal facing away from the chip carrier.

20. The chip arrangement of claim 19, further comprising:

a redistribution structure configured to electrically couple the further chip terminal with the at least one contact hole.

* * * * *